United States Patent [19]

Lienau

[11] Patent Number: 5,295,097
[45] Date of Patent: Mar. 15, 1994

[54] NONVOLATILE RANDOM ACCESS MEMORY

[76] Inventor: Richard M. Lienau, 1236 Wellesely Ave. #1, Los Angeles, Calif. 90025

[21] Appl. No.: 925,986

[22] Filed: Aug. 5, 1992

[51] Int. Cl.[5] .................... G11C 11/18; G11C 11/155
[52] U.S. Cl. ........................................ 365/170; 365/9; 365/14; 365/171; 365/173
[58] Field of Search .................... 365/9, 170, 173, 33, 365/15, 1, 171, 14, 15; 307/309; 257/314, 315

[56] References Cited

U.S. PATENT DOCUMENTS 4,360,899 11/1982 Dimyan et al. .................... 365/171
5,068,826 11/1991 Matthews ............................ 365/170

Primary Examiner—Eugene R. LaRoche
Assistant Examiner—Son Mai
Attorney, Agent, or Firm—Freilich, Hornbaker & Rosen

[57] ABSTRACT

A nonvolatile random access memory is disclosed having a substrate (50) carrying separate magnetically polarizable domains (19) each surrounded by a full write loop member (18) and arranged to penetrate the Hall channel (36) of a dual drain FET (16) with its residual magnetic field. The domains are organized in word rows and bit columns, are each written to by a single full write current through the surrounding loop member and each read by a comparator connected to the FET drains (42, 42'). The memory can be fabricated in a variety of forms (e.g. a planar card).

12 Claims, 5 Drawing Sheets

NONVOLATILE RANDOM ACCESS MEMORY

TECHNICAL FIELD

The present invention relates generally to nonvolatile random access magnetic memories.

BACKGROUND ART

The prior art is replete with various configurations of nonvolatile random access magnetic memory structures. For example, U.S. Pat. No. 4,791,604 describes one such structure comprising a substrate including a plurality of ferromagnetic domains disposed at a corresponding plurality of distinguishable locations, or cells, generally arranged in a matrix of word rows and bit columns.

The structure of U.S. Pat. No. 4,791,604 includes fixed drive means for selectively generating magnetic fields at selected locations to write bits into the domains thereat (i.e. establish the ferromagnetic state of the domain) comprising either a logical 1 or 0. The fixed drive means generally comprises a plurality of word drive lines, i.e. one for each word row, and a plurality of bit drive lines, i.e. one for each bit in a word. In order to write a bit into a particular domain, half magnitude select currents are driven through both the word drive and bit drive lines associated with that domain. The domain will switch states only if the magnetic fields produced by the respective drive currents are additive, i.e. act in the same direction.

The structure of U.S. Pat. No. 4,791,604 also includes fixed sensing means for sensing the respective magnetic states of said domains. In various embodiments described in said U.S. Pat. No. 4,791,604, the fixed sensing means comprise either a conductive line, a Hall effect device or a semiconductor thyristor disposed in proximity to the domain.

Other exemplary U.S. Patents relating to nonvolatile random access memories, and drives and sense means therefor, include 3,370,185; 3,651,311; 3,701,126; 3,714,559; 3,825,777; 3,852,725; 3,829,883; 4,027,300; 4,048,648; 4,129,880; 4,163,986; 4,250,518; 4,276,555; 4,288,708; 4,516,144; 4,677,380; 4,689,648; and 4,698,522.

SUMMARY OF THE INVENTION

The present invention is directed to a nonvolatile random access magnetic memory having a plurality of magnetizable domains disposed at a corresponding plurality of distinguishable locations on a substrate and characterized by improved write and read structures.

In accordance with one aspect of the present invention, a write structure is provided comprised of a plurality of loop members, each loop member surrounding a different one of said domains and being tightly magnetically coupled thereto. Each loop member is uniquely connected between a word write line and a bit write line which supply a full magnitude select current to the loop member.

In accordance with a second aspect of the present invention, a read structure is provided comprised of a plurality of magnetic field sensors, each sensor disposed in close proximity to a different one of said domains and wherein each sensor has dual output terminals whose relative outputs indicate the magnetic state of the associated domain. Each sensor is connected uniquely between one of a plurality of word read lines and one of a plurality of bit read lines.

In accordance with a preferred embodiment each loop member lies in a plane substantially perpendicular to the axis of its associated domain and comprises a conductive path extending at least 270° about the domain axis.

In accordance with a further feature of the preferred embodiment each magnetic field sensor preferably comprises a Hall effect FET (field effect transistor) having dual drains.

In a preferred embodiment one of the drains of each FET has a resistance disposed therein to effect an increased voltage drop relative to the other drain.

The novel features of the invention are set forth with particularity in the appended claims. The invention will be best understood from the following description when read in conjunction with the accompanying drawings.

MODES FOR CARRYING OUT THE INVENTION

Figure 1:
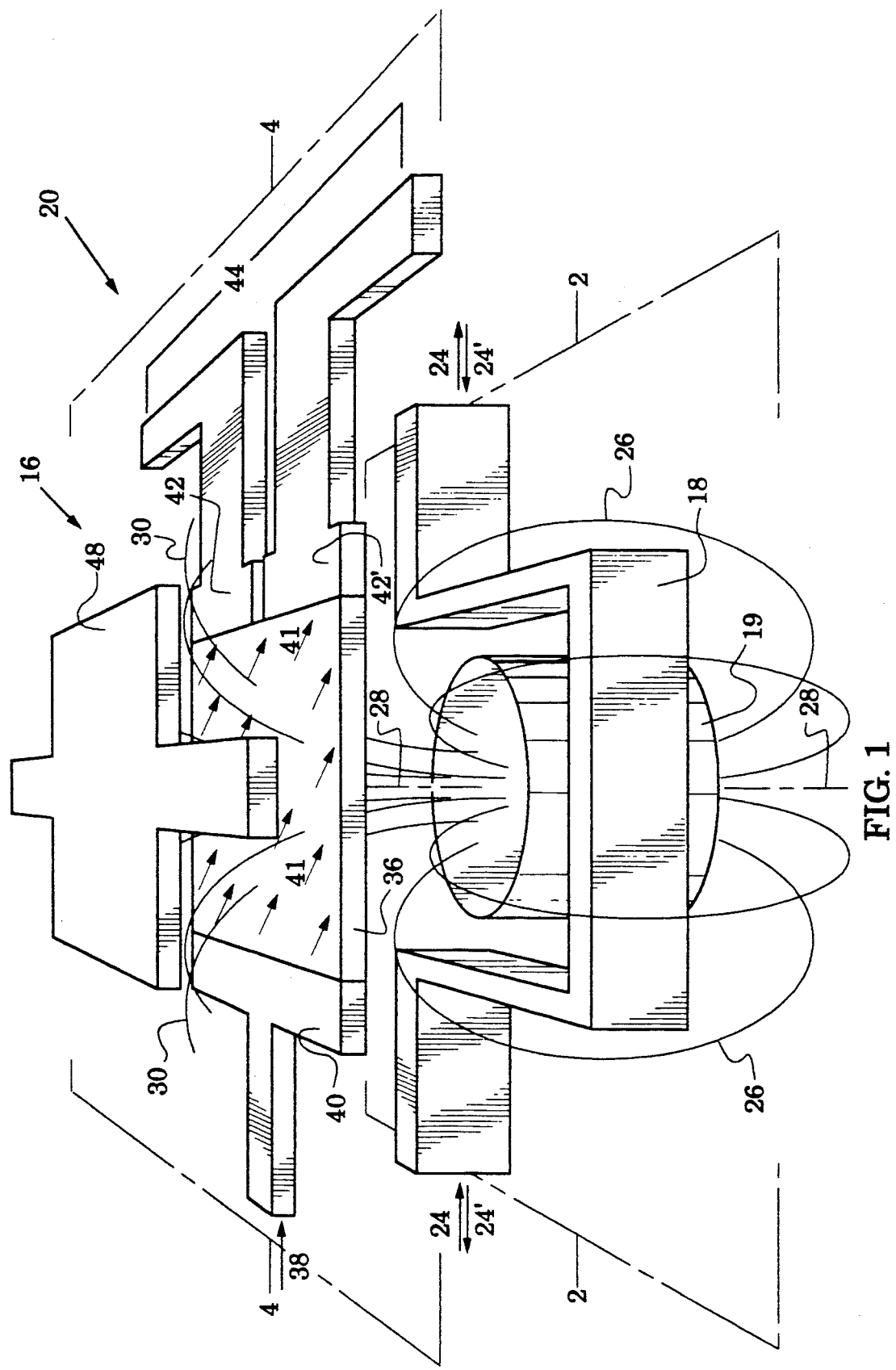
FIG. 1 is a perspective view of elements of a memory cell embodiment, in accordance with the present invention, arranged for embedding in a substrate.

The perspective view of FIG. 1 illustrates, in accordance with the present invention, a novel read/write structure having a magnetic field sensor in the form of a dual drain Hall effect FET (field effect transistor) 16 and a loop member 18 arranged in coupled read/write association with a magnetizable domain 19 to form a memory cell embodiment 20. The domain's residual magnetic field direction may be set by a single full write current pulse through the loop member 18 and read by passively sensing the polarity of a voltage potential between the FET's dual drains.

In particular, the loop member 18 substantially surrounds the domain 19 to enable oppositely directed current pulses 24, 24' through the loop member 18 to create a magnetomotive force which drives magnetic flux lines 26 through the domain 19. After the current pulse has ceased a residual magnetic field is oriented along the domain axis 28 with a flux density (indicated by the flux lines 30) set by the retentivity of the domain material. The direction of the residual magnetic field will be set upwards in FIG. 1 by a current 24 and downwards by a current 24'.

The Hall effect dual drain FET 16 is arranged proximate the domain 19 to intercept the magnetic flux lines 30 emanating therefrom with its Hall effect channel 36. The majority carriers of an electrical current 38 flowing from the FET source 40 through the Hall channel 36 are deflected (indicated by the arrows 41) by the residual magnetic field (the Hall effect) away from a first FET drain 42 and towards a second FET drain 42' to create the voltage potential 44.

The polarity of the voltage potential 44 is determined by the direction of the remnant magnetic field in the domain 19 (in the Hall effect, majority carrier deflection is normal to both the current direction and magnetic field direction). The flow of majority carriers through the Hall effect channel 36 (and the resultant voltage potential 44) can be gated by application of a voltage potential on the gate 48.

The cell elements 20 of FIG. 1 can be carried by a substrate to form a memory cell in which binary information is stored as the direction of the domain residual magnetic field 30 set by each of oppositely directed current pulses 24, 24' and passively (nondestructively) read therefrom by sensing the polarity across dual drains 42, 42' of the Hall effect FET 16. A plurality of such memory cells may be arranged in a substrate to form a nonvolatile random access memory which may be fabricated in a variety of forms (e.g. a planar card).

To enhance magnetic coupling to the domain 19 of FIG. 1, the loop member 18 preferably defines a plane normal to the domain axis 28 and, in that plane, defines a path traversing at least 270 degrees about the axis 28. Although the loop member embodiment 18 illustrated in FIG. 1 defines substantially a single turn along a rectilinear path about the domain axis 28, other loop member embodiments in accordance with the invention may define multiple turns and other path shapes (e.g. circular). In FIG. 1 the flux lines 26, 30 are configured for illustrative purposes and are not intended to indicate relative magnetic field strength or relative flux density.

Figure 2:
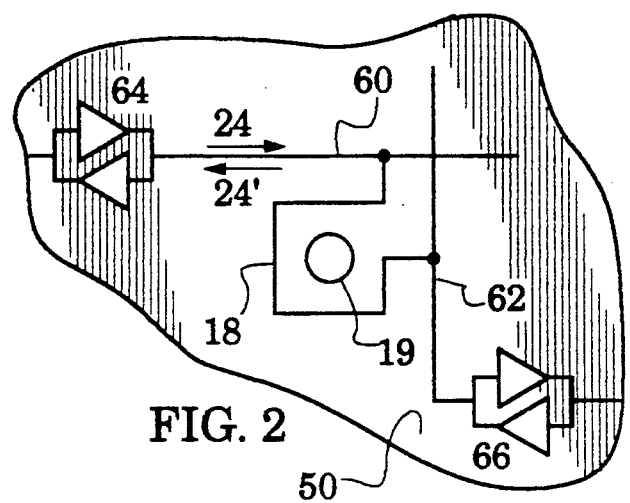
FIG. 2 is a schematic representation of a write structure embodiment for the memory cell of FIG. 1.
Figure 3:
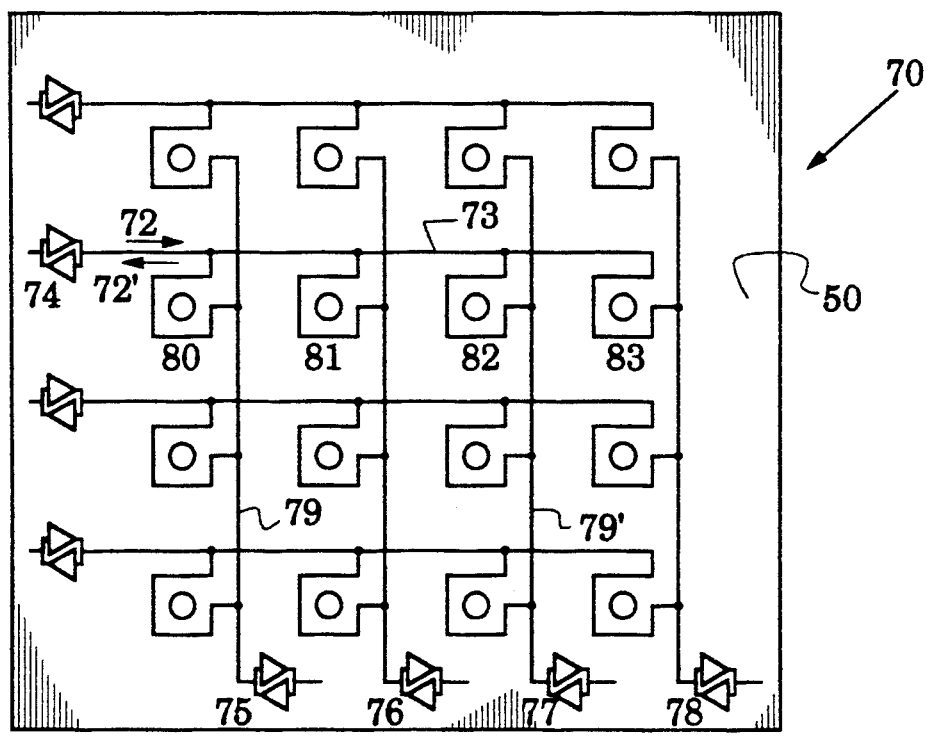
FIG. 3 is a schematic representation of a random access write structure embodiment utilizing a plurality of the memory cell of FIG. 1.

FIGS. 2, 3 are schematic representations of write structure embodiments for respectively a single memory cell and an array of memory cells utilizing the elements of FIG. 1. FIG. 2 illustrates, on a substrate 50, the loop member 18 surrounding the domain 19 (as in the plane 2—2 of FIG. 1) and connected between a line 60 and a line 62. Bidirectional currents 24, 24', selectably supplied by the bidirectional current driver 64 in cooperation with the bidirectional current driver 66, each have a magnitude sufficient to set a residual magnetic field in the domain 19 (i.e. currents 24, 24' are each full write currents).

The domains of the write array 70 of FIG. 3 are arranged in a substrate 50 in word rows and bit columns. The array may be functionally described by an example in which a first current pulse 72 is supplied from word write driver 74 along a word write line 73 and bit write drivers 75, 77 activated to respectively direct a full write current around domains 80, 82 and along bit write line 79, 79' thus writing a residual magnetic field in the domains whose direction is designated as a one (word driver 74 maintains a constant voltage output so that full currents flow through the loop members).

Subsequently, an oppositely directed second current pulse 73 is supplied from word write driver 74 and directed by bit write drivers 76, 78 to write an oppositely directed residual magnetic field into domains 81, 83 designated as a zero. Thus, in this example, a four bit binary word 1010 has been written into the word row served by word driver 74.

Figure 4:
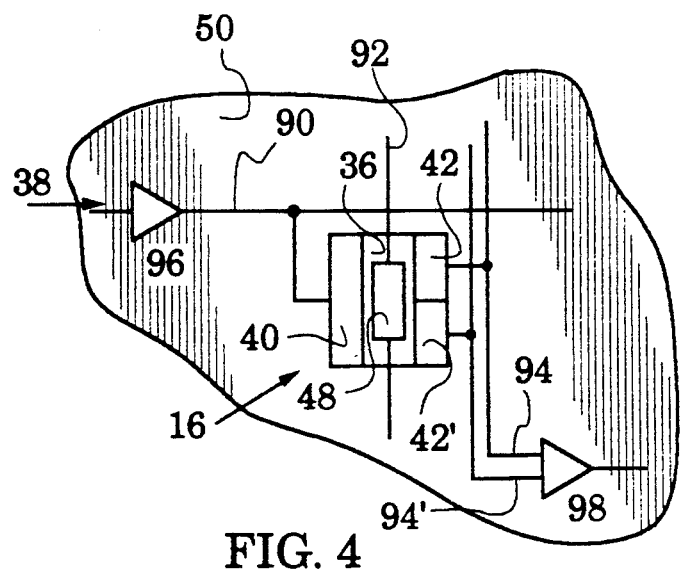
FIG. 4 is a schematic representation of a read structure embodiment for the memory cell of FIG. 1.
Figure 5:
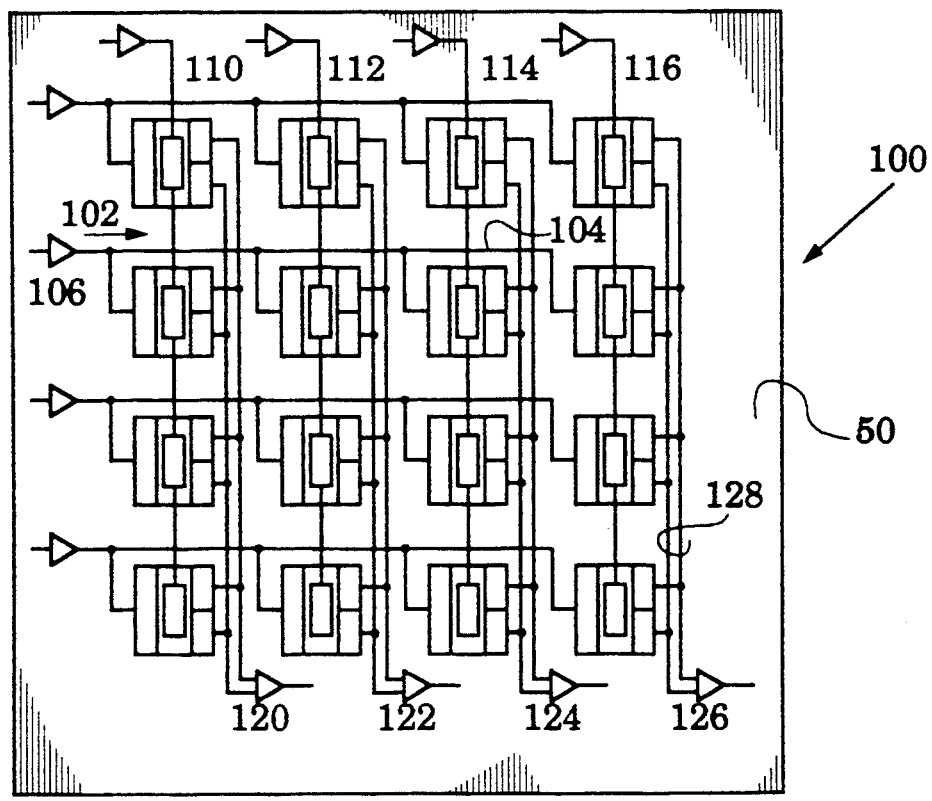
FIG. 5 is a schematic representation of a random access read structure embodiment utilizing a plurality of the memory cell of FIG. 1.

FIGS. 4, 5 are schematic representations of read structure embodiments for respectively a single memory cell and an array of memory cells utilizing the cell elements of FIG. 1. FIG. 4 illustrates the Hall effect FET 16 disposed (as in the plane 4—4 of FIG. 1) above the domain (19 in FIG. 2) with its source 40, Hall channel 36, gate 48 and dual drains 42, 42' connected between a line 90, a gate line 92 and a pair of lines 94, 94'. A current 38 supplied from a current driver 96 is deflected by the magnetic field in the Hall channel 36 to create a voltage potential across the lines 94, 94' which is sensed by a comparator 98. This potential may be gated on and off with a gate signal applied to the gate line 92.

The FETs of the read array 100 of FIG. 5 are arranged in a substrate 50 in word rows and bit columns. Continuing the array functional example initiated, above relative to FIG. 3, providing a current 102 on the word read line 104 from word read current driver 106 with enabling gate potentials placed on bit gate control lines 110, 112, 114 and 116 will cause the bit read comparators 120, 122, 124 and 126 connected to paired bit read lines (e.g. the paired bit read line 128) to output the 1010 polarity pattern stored in the domains 80-83 of FIG. 3. Applying a nonenabling gate signal to any of the gate lines will stop the flow of majority carriers in the corresponding FET which in turn causes the corresponding bit comparator output to be invalid.

Figure 6:
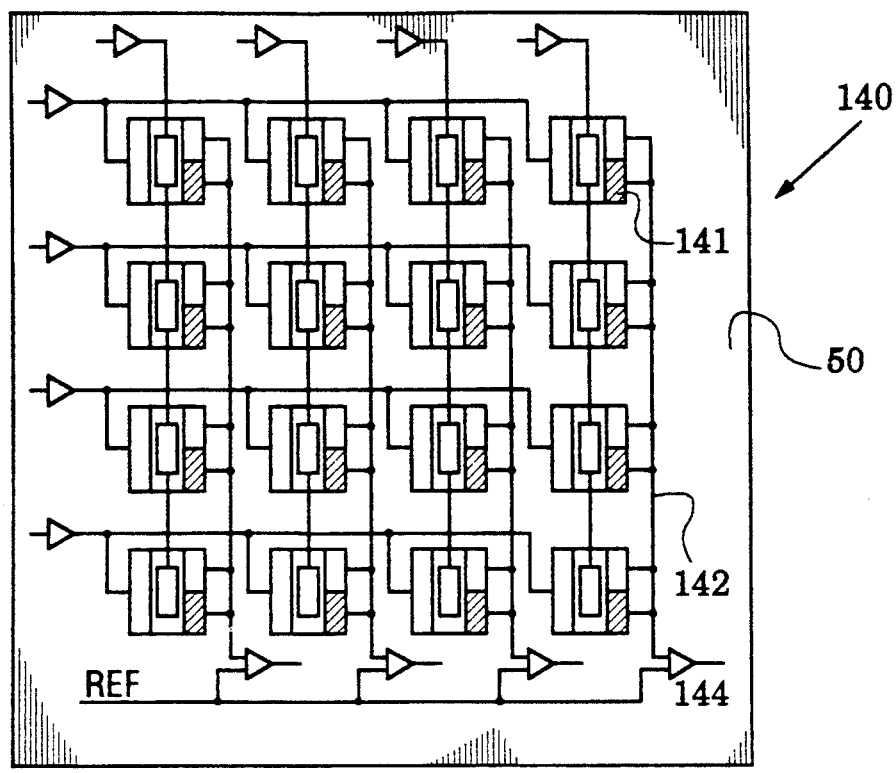
FIG. 6 is a schematic representation of another random access read structure utilizing a plurality of the memory cell of FIG. 1.

FIG. 6 illustrates another write structure embodiment 140 in which a resistor has been disposed into one drain of each FET (indicated schematically by cross hatching of that drain region, e.g. the drain 141) which enables a single bit read line (e.g. the bit read line 142) to be used for each bit column. Since one drain of each FET has a higher internal resistance than the other, there will be a voltage change on the bit read line when the drain current migrates between drains in response to a reversal in direction of the magnetic field in the corresponding domain. Thus a single read line can be compared to a reference voltage in bit comparators (e.g. comparator 144).

Figure 7:
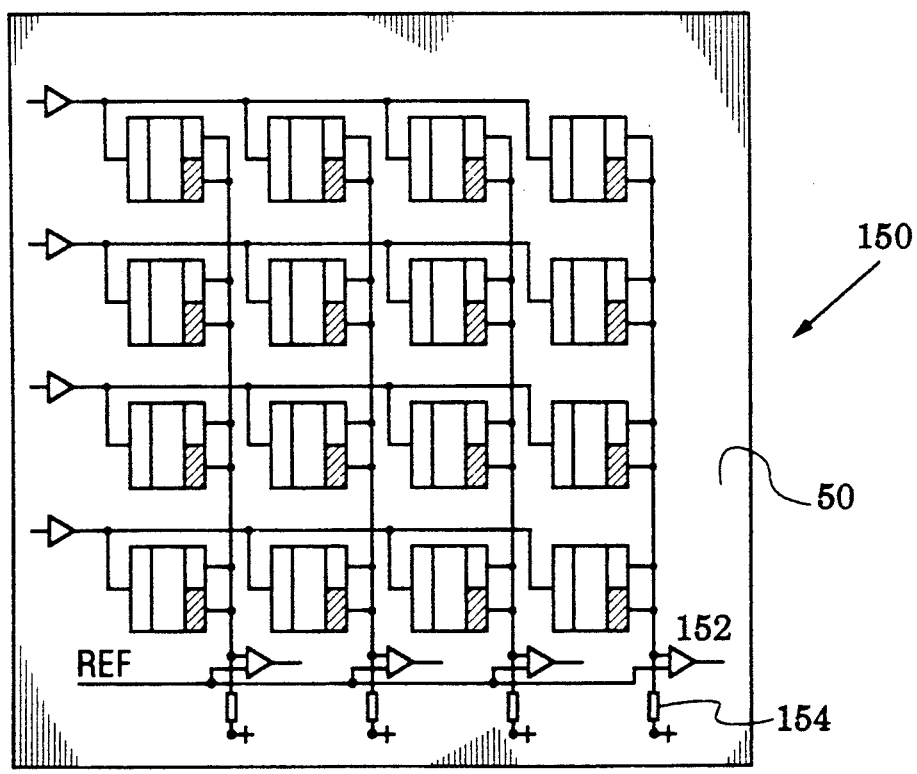
FIG. 7 is a schematic representation of another random access write structure utilizing a plurality of the memory cell of FIG. 1.

FIG. 7 illustrates another write structure embodiment 150 similar to that of FIG. 6 but using FETs lacking gates to block majority carrier flow through their channel regions. The operation of the write structure 150, therefore, is the same as that of the structure 140 except it does not include the ability to invalidate bit comparators (i.e. bit comparators such as 152 are always active). Comparators in the write structure 150 also employ a bias level shifting resistor (e.g. the resistor 154).

Figure 8:
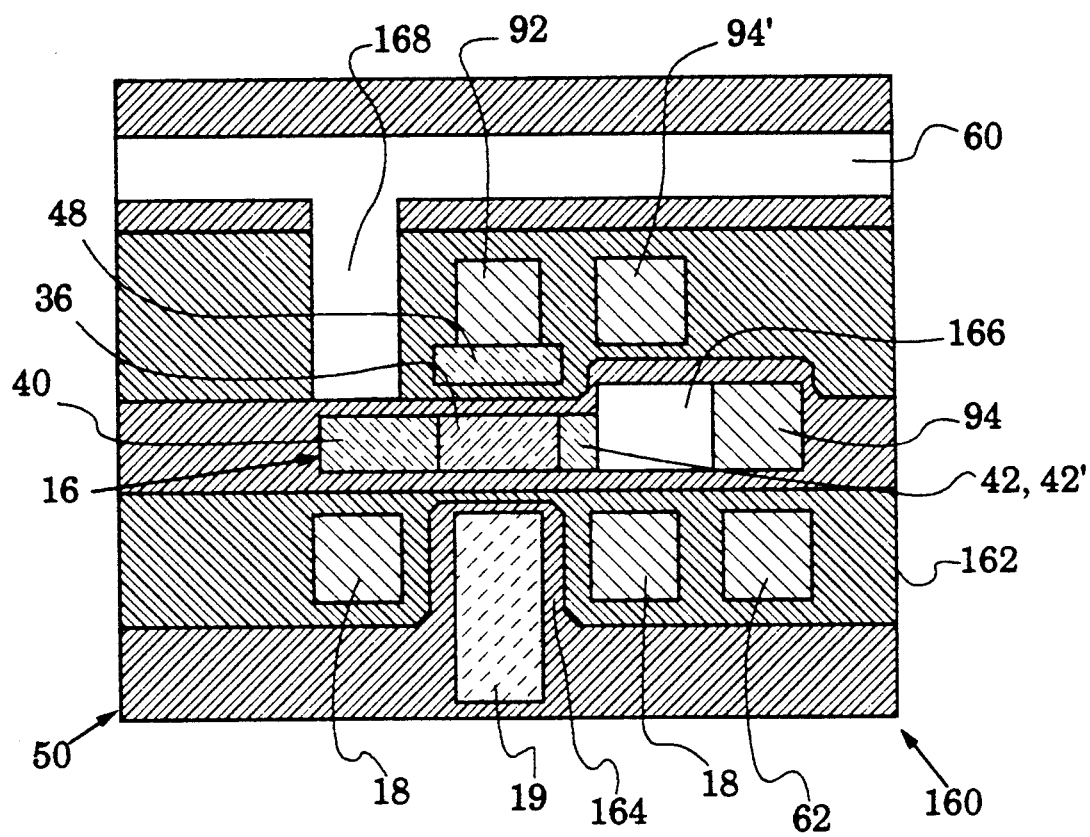
FIG. 8 is a sectional view of the memory cell elements of FIG. 1 embedded in a substrate.

FIG. 8 is a sectional view taken along a word row (e.g. the row containing domains 80-83 of FIG. 3) of a cell structure physical embodiment 160. For clarity of illustration, the reference numbers of FIGS. 2, 4 are used with word and bit designations of FIGS. 3, 5 for corresponding elements of FIG. 8. The cell structure 160 has a magnetically polarizable domain 19 and a surrounding loop member 18, arranged below the Hall channel 36 of a Hall effect gated FET 16. These cell elements along with read and write lines are embedded in layers of an insulating material (e.g. silicon dioxide). Substrate layer 162 has been etched to form a well 164 for receiving the domain 19 to, thereby, locate it within the loop member 18.

The magnetically polarizable domain 19 is preferably formed of a material exhibiting a low coercive force and a high remanence (e.g. cobalt iron, nickel-iron, ferrous nitrate) which may be deposited (e.g. sputtered, plated) in micron sized (e.g. one micron long by ¼ micron diameter) dimensions.

The FET gate 48 lies above the channel 36 and is accessed by a gate line 92. One of the dual drains 42, 42' is visible with a lateral line 166 (lines 166, 60 and 168 adjoin the section plane of FIG. 8 and thus are not shown in sectional form) connecting it to the bit read line 94. The other bit read line 94' connects similarly to the hidden source.

The word write line 60 runs laterally and has a descending arm 168 to connect (behind the source 40) with the loop member 18. A bit write line 62 is shown running adjacent the loop member 18 to facilitate connecting thereto.

The write lines 60, 62, bit read lines 94, 94' and gate line 92 shown in FIG. 8 preferably are formed of a low resistivity material compatible with integrated circuit fabrication (e.g. aluminum).

Although the domain 19 axis is shown oriented normal to the substrate 50 surface in FIG. 8 various other relative orientations may be envisioned within the teachings of the invention.

It is anticipated that the Hall channel 36 of the FET 16 shown in FIG. 1 is fabricated from silicon to obtain its linear output characteristics although the teachings of the invention could be extended to other semiconductors (e.g. gallium arsenide).

Although the physical embodiment 160 of FIG. 8 utilizes separate magnetically polarizable domains 19, it is recognized that the invention could also be realized with a homogeneous substrate layer in which the domains are defined by the magnetomotive force of loop members 18. It is also recognized that other domain shapes in addition to the idealized cylindrical structure shown in FIG. 1 may be realized (e.g. needle-like, rectilinear, rough-textured cylinder).

The invention has been described with the aid of a planarly arranged substrate but it is recognized that the teachings of the invention may be realized in other substrate shapes (e.g. curved, cylindrical) where suitable for specialized applications.

Although FET devices lend themselves readily to the nondestructive readout teachings of the invention because their relatively large channel regions are open to majority carrier movement, other semiconductor devices such as bipolar transistors designed with dual collectors or emitters associated with a region adjacent the base to facilitate deflection of the majority carriers may also find use in embodiments of the invention.

Electrical access to the memory elements through their write, gate and read lines may be effected in numerous manners well known in the art (e.g. electrical contacts arranged along a substrate edge).

From the foregoing it should now be recognized that a nonvolatile random access memory has been disclosed herein incorporating a novel read/write structure. The memory is especially suitable for fabrication in a variety of forms (e.g. a planar card such as that shown in FIG. 8 of U.S. Pat. No. 4,791,604).

The preferred embodiments of the invention described herein are exemplary and numerous modifications, dimensional variations and rearrangements can be readily envisioned to achieve an equivalent result, all of which are intended to be embrace within the scope of the appended claims.

What is claimed is:

1. A nonvolatile random access memory, comprising: a substrate;
a plurality of separate magnetically polarizable domains carried by said substrate, each domain having its axis oriented substantially normal to the surface of said substrate;
a plurality of word write lines carried by said substrate;
a plurality of bit write lines carried by said substrate;
a plurality of conductive loop members carried by said substrate, each loop member substantially surrounding and being coupled to a different one of said domains and defining a plane oriented substantially normal to the axis of said different one of said domains, each of said loop members uniquely connected between one of said word write lines and one of said bit write lines;
means connected to said word write lines and said bit write lines for driving either a first or second oppositely directed current through a selected loop member of sufficient magnitude to switch the residual magnetic field direction of the domain couple thereto; and
a plurality of sensors, each located proximate a different one of said domains for passively sensing the residual magnetic field direction of that domain.

2. The memory of claim 1 wherein said sensors each comprise a field effect transistor defining a Hall effect channel connected to a pair of drains and oriented for penetration of its channel by the residual magnetic field of a different one of said domains.

3. The memory of claim 2 further comprising:
a plurality of word read lines carried by said substrate;
a plurality of paired bit read lines carried by said substrate;
each of said field effect transistors uniquely connected with its source to one of said word read lines and each of its drains to one of said paired bit read lines;
means for selectively supplying a current to each of said word read lines; and
means for comparing the voltage across each of said paired bit read lines.

4. The memory of claim 2 wherein each field effect transistor further comprises a gate controlling majority carrier flow through its channel.

5. The memory of claim 1 wherein said substrate substantially defines a plane.

6. The memory of claim 1 wherein each of said loop members defines a path traversing at least 270 degrees about said domain axis.

7. The memory of claim 2 wherein one of said drains exhibits a greater resistance than the other and further comprising:
a plurality of word read lines carried by said substrate;
a plurality of bit read lines carried by said substrate;
each of said field effect transistors uniquely connected with its source to one of said word read lines and each of its drains to one of said bit read lines;
means for selectively supplying a current to each of said word read lines; and
means for comparing the voltage on each of said bit read lines to a reference voltage.

8. A nonvolatile random access memory, comprising:
a substrate;

a plurality of separate magnetically polarizable domains carried by said substrate, each domain having its axis oriented substantially normal to the surface of said substrate;

a plurality of word read lines carried by said substrate;

a plurality of bit read lines carried by said substrate;

a plurality of field effect transistors carried by said substrate, each defining a Hall effect channel connected to a pair of drains and each oriented for penetration of its channel by the residual magnetic field of a different one of said domains, each of said field effect transistors uniquely connected between one of said word read lines and one of said bit read lines;

means connected to said word read lines and said bit read lines for detecting a voltage potential between the drains of a selected one of said field effect transistors; and means, coupled to each of said domains, for switching the residual magnetic field direction thereof, said switching means comprising a plurality of conductive loop members carried by said substrate, each loop member substantially surrounding and being coupled to a different one of said domains.

9. The memory of claim 8 further comprising:

a plurality of word write lines carried by said substrate;

a plurality of bit write lines carried by said substrate;

each of said loop members uniquely connected between one of said word write lines and one of said bit write lines; and means connected to said word write lines and said bit write lines for driving either a first or second oppositely directed current through a selected loop member of sufficient magnitude to switch the residual magnetic field direction of the domain coupled thereto.

10. A method of forming a nonvolatile random access memory, comprising the steps of:

providing a substrate carrying a plurality of separate magnetically polarizable domains, each domain having its axis oriented substantially normal to the surface of said substrate;

providing in said substrate a plurality of conductive loop members, each loop member substantially surrounding a different one of said domains and defining a plane oriented substantially normal to the axis of that domain;

supplying a first or second oppositely directed full select current to each loop member to switch the direction of the residual magnetic field of the domain surrounded thereby; and providing in substrate, proximate each of said domains, a magnetic field direction sensor.

11. The method of claim 10 wherein said sensor providing step comprises the steps of:

providing a plurality of field effect transistors each defining a Hall effect channel and a pair of drains; and arranging each of said field effect transistors such that its channel is penetrated by the residual magnetic flux of a different one of said domains.

12. A method of forming a nonvolatile random access memory, comprising the steps of:

providing a substrate carrying a plurality of separate magnetically polarizable domains, each domain having its axis oriented substantially normal to the surface of said substrate;

providing in said substrate a plurality of field effect transistors each defining a Hall effect channel and a pair of drains;

arranging each of said field effect transistors such that its channel is penetrated by the residual magnetic flux of a different one of said domains; and providing in said substrate, proximate each of said domains, a current carrying loop member to switch the domain residual magnetic field direction, each loop member substantially surrounding a different one of said domains and defining a plane oriented substantially normal to the axis of that domain.

* * * * *